(12) United States Patent
Tanaka

(10) Patent No.: US 11,550,510 B2
(45) Date of Patent: Jan. 10, 2023

(54) ENCODING AND DECODING DATA BITS STORED IN A COMBINATION OF MULTIPLE MEMORY CELLS

(71) Applicant: Micron Technology, Inc., Boise, ID (US)

(72) Inventor: Tomoharu Tanaka, Yokohama (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/315,738

(22) Filed: May 10, 2021

(65) Prior Publication Data
US 2022/0357885 A1    Nov. 10, 2022

(51) Int. Cl.
| | | |
|---|---|---|
| G06F 12/00 | (2006.01) | |
| G06F 3/06 | (2006.01) | |
| G11C 16/04 | (2006.01) | |
| G11C 16/26 | (2006.01) | |

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/26* (2013.01)

(58) Field of Classification Search
CPC .... G06F 3/0659; G06F 3/0604; G06F 3/0679; G11C 16/0483; G11C 16/26
USPC ...................................................... 711/103
See application file for complete search history.

(56) References Cited

U.S. PATENT DOCUMENTS

| | | | | |
|---|---|---|---|---|
| 2019/0080752 A1* | 3/2019 | Hwang | .................. | G11C 16/26 |
| 2020/0192759 A1* | 6/2020 | Hwang | .................. | G11C 29/52 |

FOREIGN PATENT DOCUMENTS

CN     107657982 A  *  2/2018  ......... G06F 12/0246

OTHER PUBLICATIONS

Tanaka et al., A 3/4 Mbyte/sec Programming 3-Level NAND Flash Memory Savings 40% Die Size Per Bit, Symposium on VLSI Circuits Digest of Technical Papers, 1997, Japan, 2 pages.

* cited by examiner

*Primary Examiner* — Mardochee Chery
(74) *Attorney, Agent, or Firm* — Lowenstein Sandler LLP

(57) ABSTRACT

A device includes a memory array with first memory cell and second memory cell, and control logic, operatively coupled with the memory array, to cause a first threshold voltage (Vt) state read out of the first memory cell to be converted to a first integer value and a second Vt state read out of the second memory cell to be converted to a second integer value; translate a combination of the first integer value and the second integer value to a set of three logical bits; and output, as a group of logical bits to be returned in response to a read request, the set of three logical bits with a second set of logical bits corresponding to the first Vt state and a third set of logical bits corresponding to the second Vt state.

20 Claims, 12 Drawing Sheets

ENCODING AND DECODING DATA BITS STORED IN A COMBINATION OF MULTIPLE MEMORY CELLS

TECHNICAL FIELD

Embodiments of the disclosure are generally related to memory sub-systems, and more specifically, relate to encoding and decoding data bits stored in a combination of multiple memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
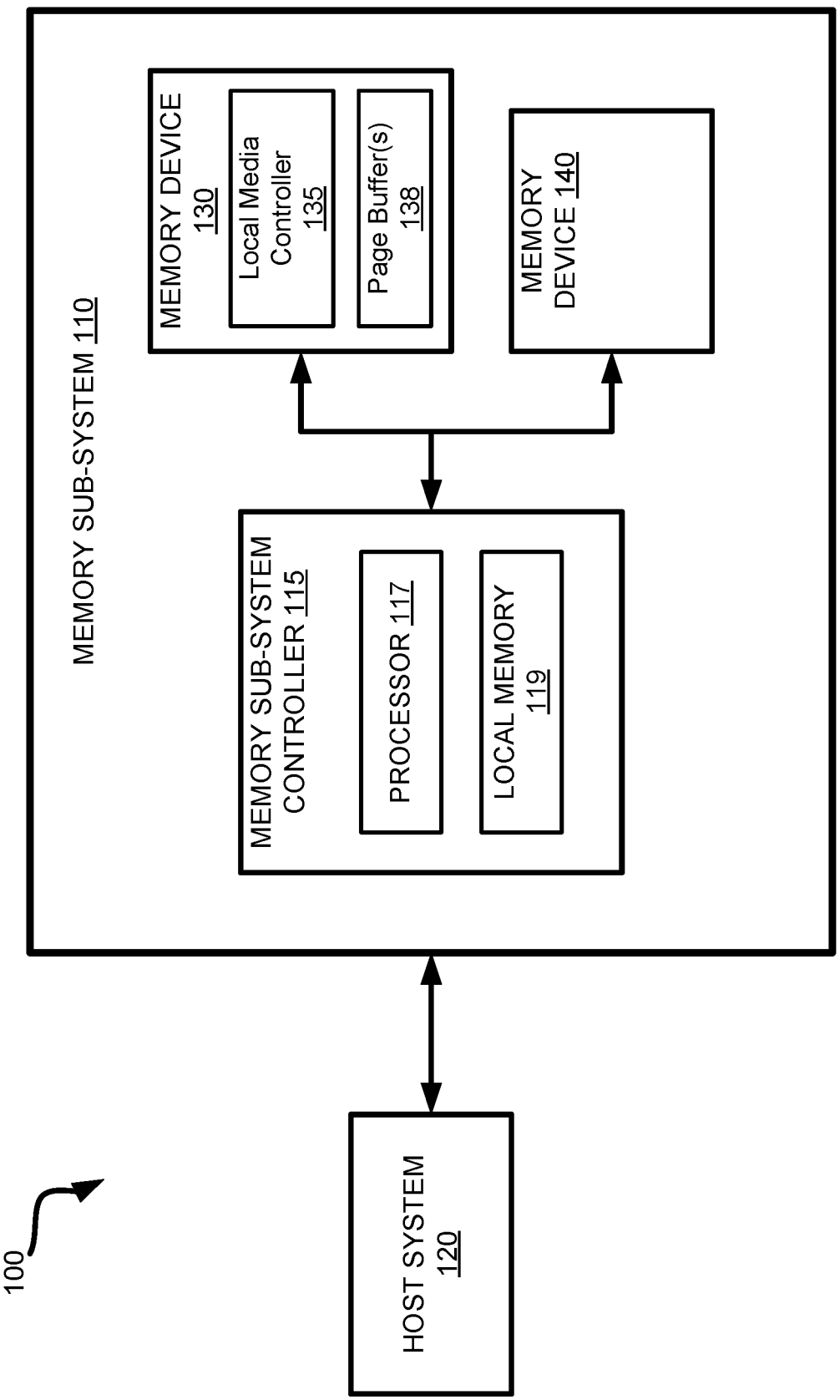
FIG. 1 illustrates an example computing system that includes a memory sub-system in accordance with some embodiments.

Embodiments of the present disclosure are directed to encoding and decoding data bits stored in multiple memory cells of a memory array. In certain memory systems, memory cells of a memory array each store an encoding of three logical bits, e.g., are configured as triple-level cell (TLC) memory cells. In order to further increase the number of logical bits encoded per cell, four-bits-per-cell technology is a straightforward way to do so, as no additional encoding or decoding is necessary. However, read window bandwidth (RWB) becomes significantly tighter when adding eight ("8") additional threshold voltage (Vt) levels, e.g., going from encoding 8 logical states to encoding 16 logical states in each memory cell. This RWB refers to the amount of voltage that separates two neighboring voltage distributions from each other. The narrower the RWB, the harder to resolve the Vt level of transition between two logical states (e.g., data bits) of the memory cell. Overly narrow RWB can thus result in higher bit error rates when reading data out of each memory cell that has been so converted.

Similarly, in other memory systems, the memory cells of a memory array each store encodings for four logical bits, e.g., are configured as quad-level cell (QLC) memory cells. In order to further increase the number of logical bits stored per cell, five-bits-per-cell technology is a straightforward way to do so, as no additional encoding or decoding is necessary. However, as in the increased bits in the TLC memory cells discussed above, the RWB becomes significantly tighter when adding 16 additional Vt levels, e.g., going from 16 logical states to 32 logical states encoded in each memory cell. Overly narrow RWB can thus result in higher bit error rates when reading data out of each memory cell that has been so converted.

Aspects of the present disclosure address the above and other deficiencies through storing an encoding for an intermediate number of logical bits, such as three and a half ("3.5") logical bits per cell, and thus 7 logical bits per pair of memory cells, in the memory systems configured with TLC memory cells and four and a half ("4.5") logical bits per cell, and thus 9 logical bits per pair of memory cells, in the memory systems configured with QLC memory cells. Because both of two memory cells are programmed with an encoding corresponding to a set of three logical bits, e.g., one and a half ("1.5") bits per cell, to make these strategies possible, additional encoding and decoding can be employed in order to program logical bits to and read the programmed logical bits from a pair of memory cells. In one embodiment, the two memory cells are a pair of adjacent memory cells. For ease of explanation, the pair of memory cells is referred to as a first memory cell and a second memory cell of a memory array.

In various embodiments, to avoid the need for 4 bits of control data (to encode/decode 7 bits for each memory cell of the TLC embodiment) or 5 bits of control data (to encode/decode the 9 bits for each memory cell of the QLC embodiment), control logic can encode the above referenced set of three logical bits (e.g., that are base two values) within a combination of the pair of memory cells, e.g., as a first threshold voltage state (or level) stored in the first memory cell and a second threshold voltage state (or level) stored in the second memory cell. Because each of these states can represent one of three different integer values (e.g., 0, 1, or 2, or others), the combined two-state value for the combination of the two memory cells can be translated into the three logical bits, e.g., as the three least significant bits of the logical bits being programmed. This translation can be performed using an integer-to-logical value decoding table, as will be discussed. Because each integer value corresponds to a subset of a series of threshold voltage levels, a low-resolution sense operation can be performed initially to determine, for example, whether the threshold voltage (Vt) level is within one of a set of lower Vt states (corresponding to a zero value), a set of middle Vt states (corresponding to a 1 value), or a set of upper Vt states (corresponding to a 2 value), as will be discussed in more detail. Such a low-resolution read operation can be performed at lower resolution than a standard read operation in order to identify a coarse grouping (lower, middle, or upper) of possible Vt states in which the Vt state of the memory cell resides. As an extension, the first threshold voltage state can also be separately encoded as a second set of logical bits and the second threshold voltage state can also be separately encoded as a third set of logical bits, which when combined with the initial set of logical bits, can represent the programmed logical bits within the combination of the first memory cell and the second cell.

Thus, in these embodiments, when the logical bits are being decoded, the control logic causes a first threshold voltage state read out of the first memory cell to be converted to a first integer value and a second threshold voltage state read out of the second memory cell to be converted to a second integer value. The control logic can further translate a combination of the first integer value and the second integer value to the set of three logical bits corresponding to a combination of the first and second threshold voltage states. The control logic can further output, as a group of logical bits to be returned in response to a read request, the set of three logical bits with a second set of logical bits corresponding to the first threshold voltage state and a third set of logical bits corresponding to the second threshold voltage state.

In one embodiment, the control logic interprets the first set of three logical bits as the least significant logical bits of a group of logical bits, the third set of logical bits as the most significant logical bits, and the second set of logical bits as the middle logical bits of the group of logical bits, although the ordering of the sets of logical bits can change. In one embodiment, the first memory cell and the second memory cell are each a TLC and the group of logical bits include seven logical bits. In another embodiment, the first memory cell and the second memory cell are each a QLC and the group of logical bits include nine logical bits.

In related embodiments, individual logical bits of the second and third sets of logical bits can each be encoded in a series of threshold voltage levels, where each series of threshold voltage levels corresponds to 24 total logical states for the 4.5-bits-per-cell embodiment and to 12 total logical states for the 3.5-bit-per-cell embodiment. A coding table (or other coding data structure) can be stored in the memory device, which can be accessed by the control logic to determine which of three subsets of the series of threshold voltage levels are to be sensed in order to determine the second and third sets of logical bits. Each subset of the three subsets can correspond (e.g., be indexed) to one of the three possible integer states of the first and second threshold voltage states of the first and second memory cells. The coding table can also define valley locations between the series of threshold voltage levels corresponding to bit value boundaries to simplify encoding/decoding the logical bits. A bit value boundary is a valley between threshold voltage levels of the series of threshold voltage levels where a corresponding logical state changes from a low state, e.g., "0" value, to a high state, e.g., "1" value, or vice versa. Only these transitions at bit value boundaries need be sensed, e.g., by a sense amplifier coupled with the control logic, to determine each logical state for the second and third sets of logical bits (should a discrete logical state be requested individually). In this way, by indexing to determine a subset of the series of threshold voltage levels, and then sensing at only the bit value boundaries of a requested logical bit, the memory device need only sense at one or more bit value boundaries within the subset of the series of threshold voltage levels.

By way of example, in an indexing embodiment, the control logic determines, using the first integer value to index into the coding table, first valley locations at bit value boundaries of a subset of the series of threshold voltage levels of the first memory cell. This subset can be a first subset, a second subset, or a third subset of the three subsets. The control logic can further cause a first sense amplifier to sense a first threshold voltage level at one of the first valley locations of the first memory cell. The control logic can then determine values of the second set of logical bits corresponding to the first threshold voltage level. Further, in this embodiment, the control logic determines, using the second integer value to index into the coding table, second valley locations at bit value boundaries of a second subset of the series of threshold voltage levels of the second memory cell. In one embodiment, the first and second subsets are the same. In another embodiment, the first and second subsets are different (depending on the integer values). The control logic can further cause a second sense amplifier to sense a second threshold voltage level at one of the second valley locations of the second memory cell and determine values of the third set of logical bits corresponding to the second threshold voltage level.

By way of a further example, in a direct-sense embodiment, if the first set of three bits is not needed, the control logic directs a sense amplifier to sense all of the bit value boundaries for each logical bit that is requested. Thus, the control logic can direct one or more sense amplifiers to sense all the bit value boundaries, for each identified logical bit, within the series of threshold voltage levels corresponding to the 12 logical states for the TLC embodiments or to the 24 logical states for the QLC embodiments, for example. Thus, for example, the control logic can direct the sense amplifier (s) to sense the bit value boundaries for logical bit three ("3") and for logical bit six ("6"), if those are the only two logical bits requested. In this way, the additional logic to determine the first set of logical bits and to index within the three sets of threshold voltage levels is avoided. By employing these two approaches, including a combination of the index-based approach and the direct-sense approach, expensive encoding schemes can be avoided while still increasing the bit per cell capacity by 1 bit for every two cells. While the disclosed embodiments use TLC memory cells and QLC memory cells as examples, one of skill in the art would understand how to extend application to any MLC memory, including MLC memory cells or PLC memory cells.

Therefore, advantages of the systems and methods implemented in accordance with some embodiments of the present disclosure include, but are not limited to, an efficient and flexible increase in the number of bits per cell storage capacity in a storage device, such as a NAND memory device. For example, storage capacity of different types of MLC memory cells can be increased by a bit for each pair of memory cells. This storage capacity can be increased with a minimum amount of additional hardware (as will be discussed) together with a small amount of additional logic to resolve the first threshold voltage state of the first memory cell and the second threshold voltage state of the second memory cell. The disclosed encoding/decoding, however, avoids expensive encoding that would require large numbers of control bits to carry out. Further because, of the independently read data bits of the pair of memory cells, a threshold voltage level can be sensed for a logical bit of the first memory cell concurrently with sensing a threshold voltage level for a logical bit of the second memory cell, read latency can be further decreased. Other advantages will be apparent to those skilled in the art of encoding and decoding data stored in memory cells within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane consists of a set of physical blocks. Each block consists of a set of pages. Each page include a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

Figure 2:
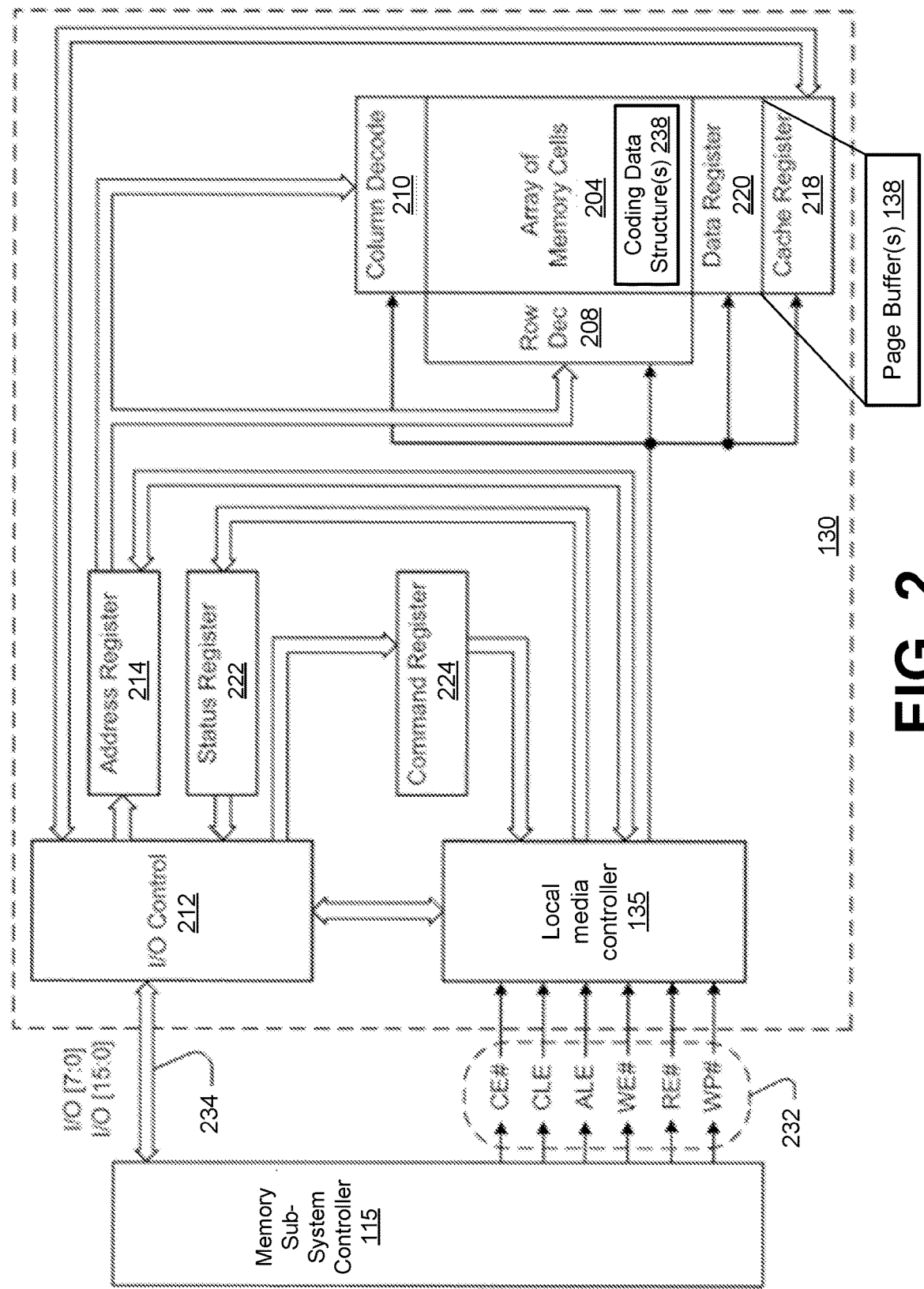
FIG. 2 is a block diagram of a memory device in communication with a memory sub-system controller of a memory sub-system according to an embodiment.

In some embodiments, control logic of the local media controller 135 stores the first Vt state of the first memory cell in a first page buffer of the page buffers 138 and converts the first Vt state to a first integer value. The control logic can further store the second Vt state of the second memory cell in a second page buffer of the page buffers 138 and convert the second Vt state to a second integer value, e.g., so that these integer values (e.g., 0, 1, 2 for each memory cell) can be determined concurrently. The conversion of the Vt states to the integer values can occur through a 3-level column latch discussed with reference to FIG. 4B and FIGS. 5A-5C. In some embodiments, the integer values can be representations of integer values, e.g., a certain voltage level for each respective integer value, in logic and/or buffered within the 3-level column latches. In these embodiments, the control logic (which also can include control logic of the memory sub-system controller 115) can further act on the combined set of the first integer value and the second integer value e.g., to translate a combination of the first and second integer values to the first set of logical bits, as will be explained in more detail. The control logic for combining and translating the integer values can include logic circuits in a data output path, e.g., the page buffers 138, and/or input/output (I/O) control 212 (FIG. 2). The control logic can then also separately decode each of the first and second Vt states into the second and third sets of logical bits, as will be explained.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 2) of at least a portion of array of memory cells 204 are capable of being programmed to one of at least two target data states. In some embodiments, the array of memory cells 204 can also store one or more coding data structures 238 such as encoding tables and decoding tables in order to translate threshold voltage levels read out of memory cells into a series of logical bits (data states) and/or in order to more efficiently know which valleys of a series of threshold voltage (Vt) level at which to sense for particularly-requested logical bits.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic of the local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data can be passed from the cache register 218 to the data register 22 for transfer to the array of memory cells 204; then new data can be latched in the cache register 218 from the I/O control circuitry 212. During a read operation, data can be passed from the cache register 218 to the I/O control circuitry 212 for output to the memory sub-system controller 115; then new data can be passed from the data register 220 to the cache register 218. The cache register 218 and/or the data register 220 can form (e.g., can form a portion of) a page buffer 138 of the memory device 130, which is illustrated separately for purposes of explanation. The page buffer 138 can further include sensing devices (not shown in FIG. 2) such as one or more sense amplifiers to sense a data state of memory cells of the array of memory cells 204, e.g., by sensing a state of a data line connected to each memory cell. A status register 222 can be in communication with I/O control circuitry 212 and the local media controller 135 to latch the status information for output to the memory sub-system controller 115.

Memory device 130 receives control signals at the memory sub-system controller 115 from the local media controller 135 over a control link 232. For example, the control signals can include a chip enable (CE#), a command latch enable (CLE), an address latch enable (ALE), a write enable (WE#), a read enable (RE#), and a write protect (WP#). Additional or alternative control signals (not shown) can be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands can be received over input/output (I/O) pins [7:0] of I/O bus 234 at I/O control circuitry 212 and can then be written into command register 224. The addresses can be received over input/output (I/O) pins [7:0] of I/O bus 234 at I/O control circuitry 212 and can then be written into address register 214. The data can be received over input/output (I/O) pins [7:0] for an 8-bit device or input/output (I/O) pins [15:0] for a 16-bit device at I/O control circuitry 212 and then can be written into cache register 218. The data can be subsequently written into data register 220 for programming the array of memory cells 204.

In an embodiment, cache register 218 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) can be used in the various embodiments.

Figure 3:
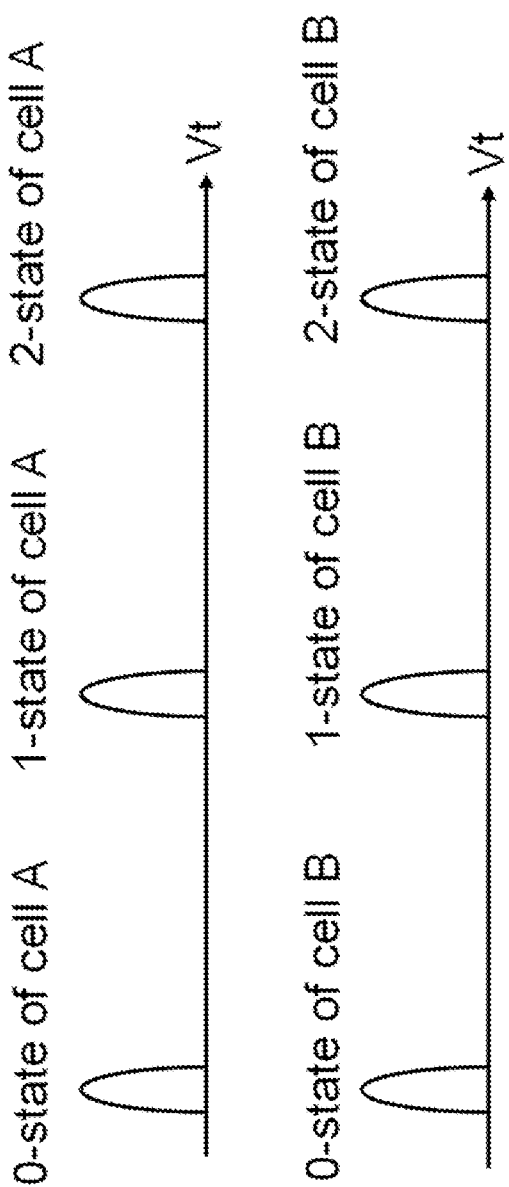
FIG. 3 is a set of graphs illustrating three possible threshold voltage (Vt) states of a first memory cell (Cell A) and of a second memory cell (Cell B) according to an embodiment.

FIG. 3 is a set of graphs illustrating three possible threshold voltage (Vt) states of a first memory cell (e.g., Cell A) and of a second memory cell (e.g., Cell B) according to an embodiment. For example, the Vt state (or level) of each of Cell A and Cell B can be located in a lower part of the cell (0-state), the middle part of the cell (1-state), or the upper part of the cell (2-state). These lower, middle, and upper Vt states can be encoded as discussed in more detail with reference to FIG. 6 (TLC embodiment) and FIG. 8 (QLC embodiment). Although these three groups of states in these three Figures are illustrated separated, in other embodiments the three groups of states can be consecutively ordered without gaps therebetween.

As discussed previously, these 0-state, 1-state, and 2-state Vt values can be converted to integer values. In various embodiments, the control logic can cause a first Vt state of the first memory cell to be converted to a first integer value. Further, the control logic can cause a second Vt state of the second memory cell to be converted to a second integer value. The control logic can then translate, using a decoding table such as Table 1, the combination of the first integer value and the second integer value to a set of three logical bits corresponding to the combination of the first and second Vt states.

TABLE 1

| Dual-Cell Vt State | | Logical Bits (Data) | | |
|---|---|---|---|---|
| Cell A | Cell B | Bit_0 | Bit_1 | Bit_2 |
| 0 | 0 | 0 | 1 | 0 |
| 0 | 1 | 0 | 1 | 1 |
| 0 | 2 | 0 | 0 | 1 |
| 1 | 0 | 1 | 1 | 1 |
| 1 | 1 | 1 | 1 | 0 |
| 1 | 2 | 1 | 0 | 0 |
| 2 | 0 | 1 | 0 | 1 |
| 2 | 1 | 0 | 0 | 0 |
| 2 | 2 | 0 | 0 | 0 |

In some embodiments, the 0-State is less than −1 volt (V), the 1-State is between 0.3-1.2V, and the 2-State is between 2.0 and 2.9V in a three-level memory cell, although other voltage ranges are envisioned that can be stored as three Vt levels, and buffered in the one or more page buffer(s) 138 while being programmed to or read out of the memory cell. These voltage ranges may especially be shifted and broadened to make room for 12 Vt states (FIG. 6) in TLCs or for 24 Vt states (FIG. 8) in QLCs. Table 1 illustrates a decoding table according one of many possible embodiments of decoding, which the control logic can access in order to perform a translation between the combination of the first and second integer values and the three logical bits. In some embodiments, while there are nine possible combinations of the three logical bits, only eight combinations may be used for logical data states. Thus, in the embodiment of Table 1, if Cells A and B express an imaginary "2-2" state as illustrated in the last row in Table 1, the 2-2 state is instead identified and auto-translated to a "2-1" state for consistency. Both the 2-1 and 2-2 states result in "0 0 0" logical bit values, so the result is the same.

Figure 4A:
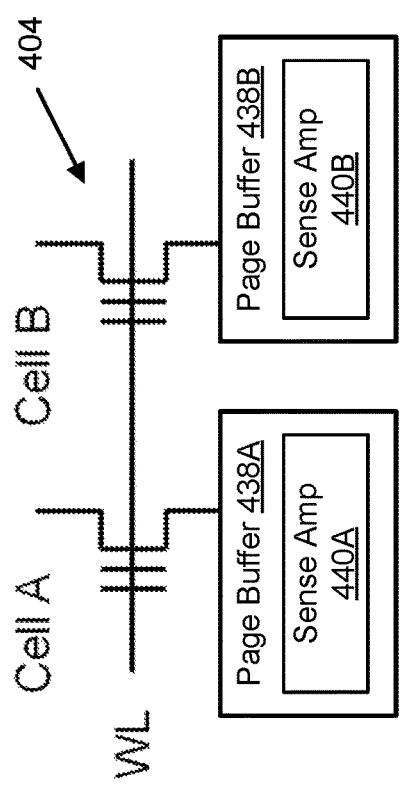
FIG. 4A is a schematic block diagram of the first and second memory cells of a memory array that are coupled to a single word line according to an embodiment.

FIG. 4A is a schematic block diagram of the first and second memory cells (e.g., Cell A and Cell B) of a memory array 404 that are coupled to a single word line (WL) according to an embodiment. The memory array 404 could be the same as, or a subpart of, the array of memory cells 204 discussed with reference to FIG. 2. In at least some embodiments, the bit line from the first memory cell (Cell A) is coupled with a first page buffer 438A and the bit line from the second memory cell (Cell B) is coupled with a second page buffer 438B. The first page buffer 438A can include a first sense amplifier 440A and the second page buffer 438B can include a second sense amplifier 440B. The control logic can be coupled with the first and second page buffers 438A and 438B in these embodiments, and can thus direct the first and second sense amplifiers 440A and 440B to sense various Vt states (e.g., the first Vt state and the second Vt state) from the first and second memory cells, which can be temporarily stored in the first and second page buffers 438A and 438B, respectively.

Figure 4B:
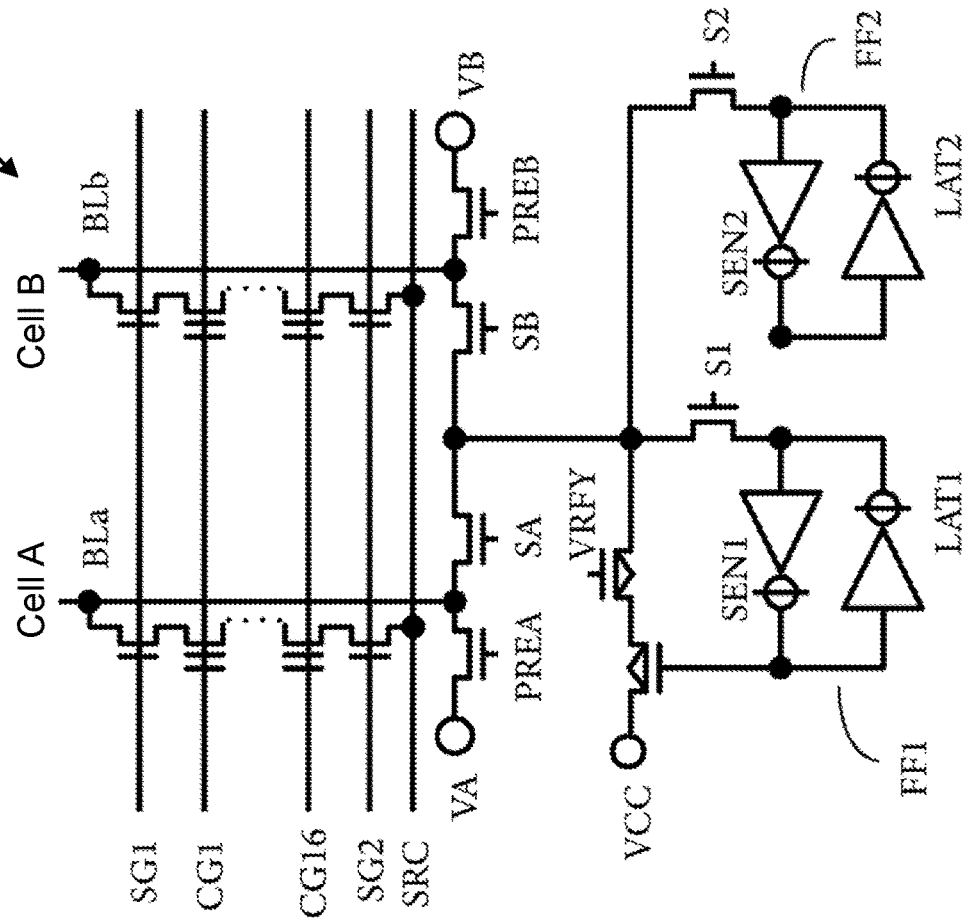
FIG. 4B is a schematic block diagram of a compact three-level column latch to enable reading out a three-level state of a memory cell according to an embodiment.

FIG. 4B is a schematic block diagram of a compact three-level column latch 450 to enable reading out a three-level state of a memory cell according to an embodiment. The three-level column latch 450 can be a compact, intelligent three-level column latch that can be operatively coupled with (or integrated within) each of the first sense amplifier 440A and the second sense amplifier 440B, for example. The three-level column latch 450, for example, can be triggered to read three-level data out of or program the three-level data to each of the first memory cell (Cell A) and the second memory cell (Cell B), where the three-level data is sensed or programmed in the form of the integer values, so as to be detectable by the control logic for translation to/from logical bits of data.

For example, the three-level column latch 450 can sense and temporarily store the three-level data (e.g., the integer values corresponding to the Vt state of a memory cell) in a pair of flip-flops, namely a first flip-flop (FF1) and a second flip-flop (FF2) illustrated in FIG. 4B. The trigger of storing certain integer values in the FF1 and the FF2 can be a way of converting the first and second Vt states of the first and second memory cells into the first and second integer values, although other logic gates are also envisioned for such conversion, and can be performed in parallel with duplicate circuitry.

TABLE 2

| | Intermediate Node | |
|---|---|---|
| 3-level data | FF1 | FF2 |
| 0 | 1 | 1 |
| 1 | 0 | 1 |
| 2 | 0 | 0 |

TABLE 3

| | Intermediate Node | |
|---|---|---|
| 3-level data | FF1 | FF2 |
| 0 | 0 | 0 |
| 1 | 1 | 0 |
| 2 | 1 | 1 |

In at least some embodiments, the first and second integer values can be understood and processed as an intermediate code stored in the pair of flip-flops as illustrated in Table 2 (for read operations) and Table 3 (for program operations). More specifically, the three-level data can be programmed into each memory cell based on values stored in FF1 and FF2 according to Table 3. The three-level data can be read out of each memory cell based on values stored into FF1 and FF2 according to Table 2. When programming these integer values to the first and second memory cells, the bit line voltage levels can be adjusted as per FIG. 5B to ensure programming the memory cells to the correct Vt range to be associated with the integer values stored in the FF1 and FF2 flip flops.

Figure 5A:
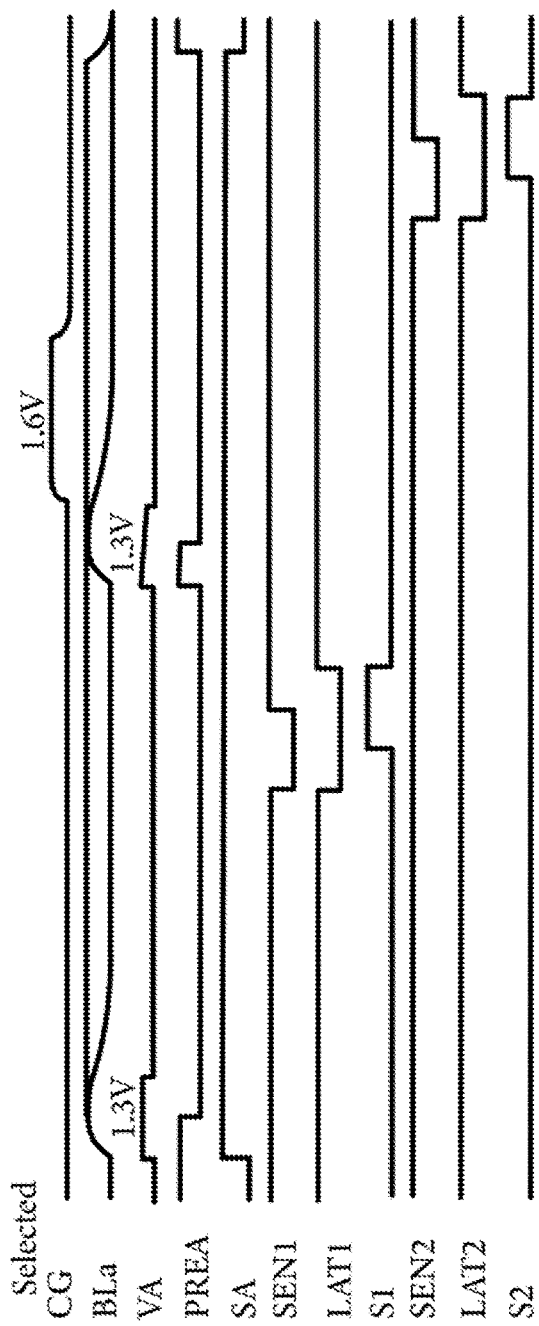
FIG. 5A is a timing chart for a read operation in response to bit lines (BLa's) being selected for the memory cells according to an embodiment.

FIG. 5A is a timing chart for a read operation (e.g., read request) in response to bit lines (BLa's) being selected for the memory cells according to an embodiment. In various embodiments, the flip-flips FF1 and FF2 detect whether the memory cell stores integer value "0" and integer value "2," respectively, else the integer value is assumed to be data "1." For a precise sensing of the threshold voltage, the bit lines are pre-charged to 1.3V and a power supply voltage supplied to the flip-flips is made to be clamped at 2V during a sensing period.

Figure 5B:
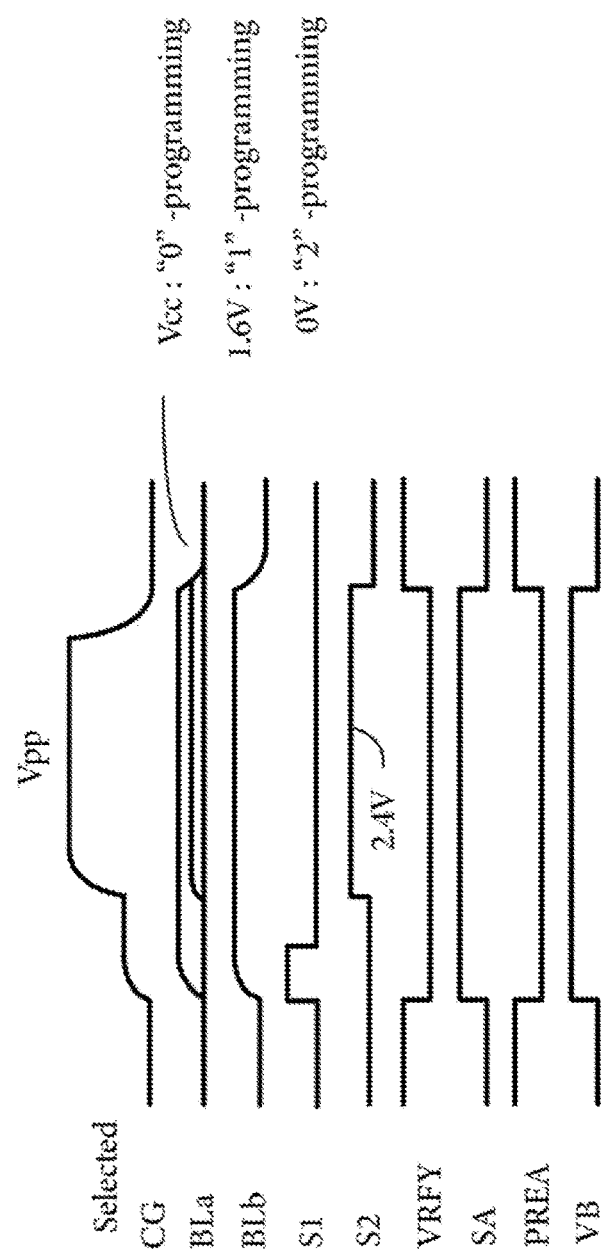
FIG. 5B is a timing chart of a program operation of a memory cell using three-level encoding in response to the bit lines (BLa's) being selected according to an embodiment.
Figure 5C:
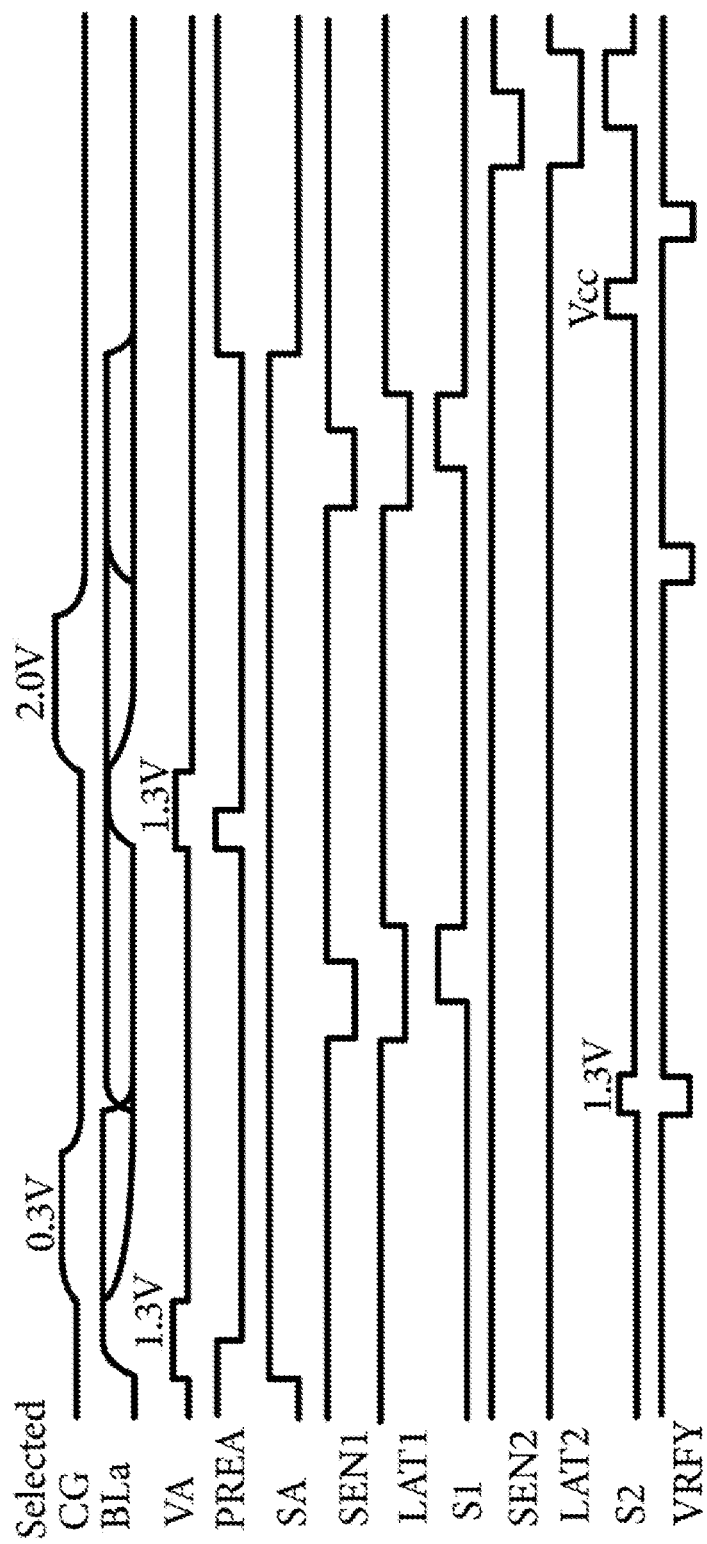
FIG. 5C is a timing chart of a program verify operation for the program operation of FIG. 5B according to an embodiment.

FIG. 5B is a timing chart of a program operation of a memory cell using three-level encoding in response to the bit lines (BLa's) being selected according to an embodiment. Program pulses (e.g., 16.5V~19.3V) are applied to the selected control gate (CG). To get a program speed of "1" programming to be close to that of 2V, programming the bit line voltage of "1" programming is raised to 1.6V. After each program operation, a program verify operation is carried out. FIG. 5C is a timing chart of a program verify operation for the program operation of FIG. 5B according to an embodiment. The intermediate codes stored in the column latches are modified such that the "1" or "2" programming are respectively executed on only memory cells in which data "1" or "2" has not been successfully programmed.

Figure 6:
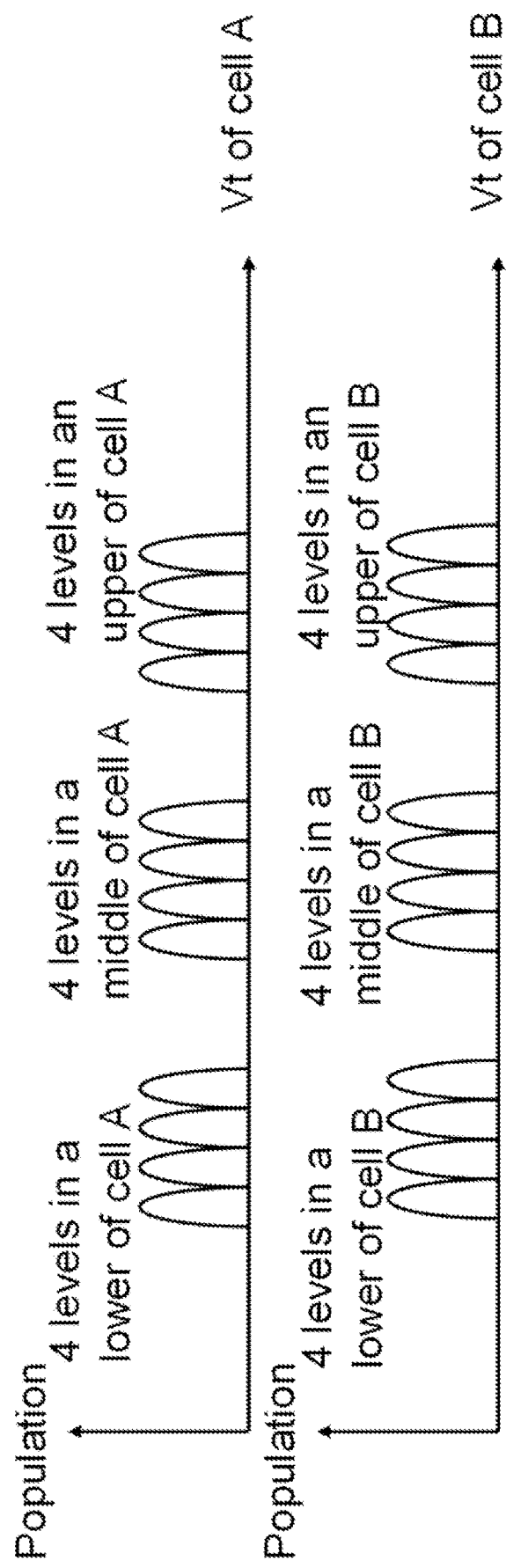
FIG. 6 is a graph of four threshold voltage levels capable of being programmed to lower, middle, and upper portions of a first memory cell and a second memory cell according to some embodiments.

FIG. 6 is a graph of four threshold voltage levels capable of being programmed to lower, middle, and upper portions of a first memory cell and a second memory cell according to the 3.5-bits-per cell embodiment. Three and a half ("3.5") logical bits can be encoded per cell by encoding 7 bits in a pair of TLC memory cells, each having 12 Vt states. A total of 144 (e.g., 12×12) discrete Vt states are possible in two different cells, which can be a pair of adjacent memory cells. Of the 144 Vt states, 128 combined Vt states can be used to express 7 logical bits. Unlike encoding 3 logical bits or 4 logical bits per cell, an encoding/decoding scheme is employed to control read and program operations with 12 Vt states encoded in each of the pair of memory cells. From 7 logical bits of user data, two 4-bits of control data would need to be employed, one for the first memory cell and another for the second memory cell, which imparts a heavy cost for encoding and decoding.

Instead of employing 128 Vt states to encode/decode all 7 logical bits, the first memory cell can encode two ("2") logical bits that do not need to be combined with data encoded in another cell and 1.5 logical bits that are to be combined with logical bits encoded in the second memory cell. Similarly, the second memory cell can store two ("2") logical bits that do not need to be combined with logical bits encoded in another cell and 1.5 logical bits that are to be combined with the 1.5 logical bits encoded in the first memory cell. The encoding and decoding of 3 logical bits across the two memory cells was discussed with reference to FIG. 4B and FIGS. 5A-5C.

Figure 7:
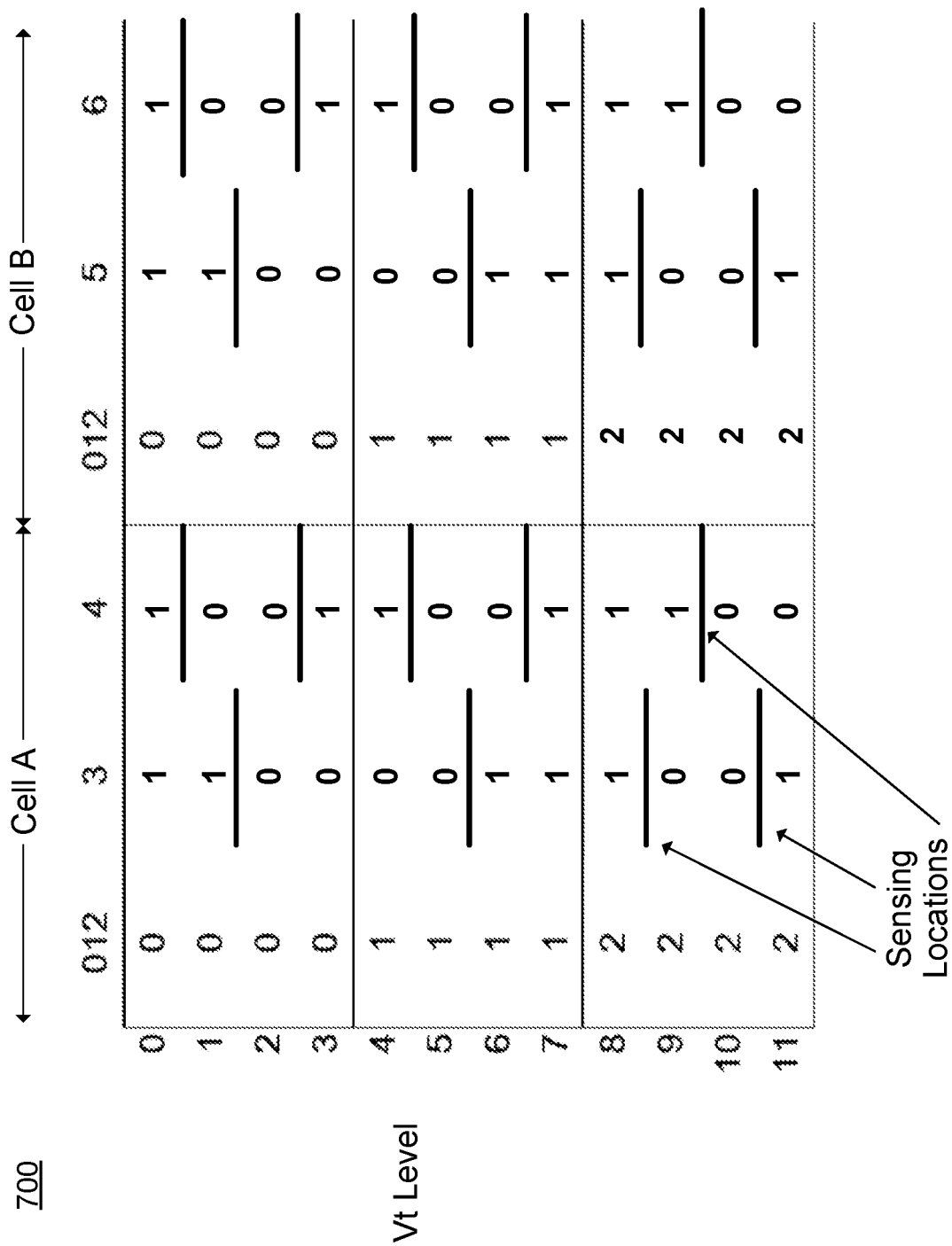
FIG. 7 is a graph illustrating a coding data structure for translating threshold voltage levels across the 12 levels (FIG. 6) of each memory cell into seven logical values of data for a combination of the first and second memory cells according to an embodiment.

FIG. 7 is a graph illustrating a coding data structure 700 for translating threshold voltage levels across the 12 levels (FIG. 6) of each memory cell into seven ("7") logical values of data for a combination of the first and second memory cells according to the TLC embodiment. The coding data structure 700 can be stored on the memory device 130 (e.g., the coding data structure 238 stored in the memory array 204) or in the local memory 119 of the controller 115, for example. The coding data structure 700, which can be a table in one embodiment, includes a series of threshold voltage (Vt) levels in the left-most column (e.g., Vt states 0 through 11) associated with both the first memory cell (Cell A) and the second memory cell (Cell B). The coding data structure 700 then includes the encoding of logical bits in the subsequent columns for each of the first memory cell (Cell A) and the second memory cell (Cell B).

In at least some embodiments, the first Vt state of the first memory cell is converted to a integer value of 0, 1, or 2, illustrated as the first column of the encoding columns for the first memory cell (Cell A). As discussed, the control logic can convert each Vt state using a low-resolution sense operation sufficient to determine in which coarse grouping of Vt states each Vt state resides, and thus a integer value of 0, 1, or 2 or the like. More specifically, there are a set of predefined coarse Vt ranges (e.g., lower, middle, upper), each one corresponding to a coarse integer value. During a low-resolution read, the control logic determines in which of the set of predefined coarse Vt ranges (e.g., lower, middle, upper) the Vt of each memory cell is located, and assigns the memory cell a corresponding integer value, e.g., a 0 value for lower, a 1 value for middle, or a 2 value for upper, although different integer values are possible as well.

Subsequent columns for the first memory cell are logical bit encodings for logical bits 3 and 4. Thus, the integer value converted for the first memory cell can be used as an index to determine first valley locations at bit value boundaries of a subset of the series of threshold voltage levels of the first memory cell. As a reminder, a bit value boundary is a valley between threshold voltage levels of the series of threshold voltage levels where a corresponding logical state changes from a low state, e.g., "0" value, to a high state, e.g., "1" value, or vice versa, illustrated with the short horizontal lines in FIG. 7. Further, the "subset" can be understood to be a subset of the Vt states illustrated as rows across the coding data structure 700. Control logic can then cause sensing at these first valley locations to determine logical bits 3 and 4. So, for example, if the integer value is zero ("0"), the valley sense locations are illustrated as the horizontal lines in the top left quadrant of the coding data structure 700. This narrows down sensing to valleys located between the bit value boundaries, thus a single valley location for logical bit 3 and two valley locations for logical bit 4.

In these embodiments, the second Vt state of the second memory cell is converted to a integer value of 0, 1, or 2, illustrated as the first column of the encoding columns for the second memory cell (Cell B). As discussed, the second Vt state can be determined using a low-resolution sense operation sufficient to determine in which grouping of Vt states the second Vt state resides, and thus a integer value of 0, 1, or 2. Subsequent columns for the second memory cell are logical bit encoding for logical bits 5 and 6. Thus, the integer value converted for the second memory cell can be used as an index to determine second valley locations at bit value boundaries of a second subset of the series of threshold voltage levels of the second memory cell. Control logic can then cause sensing at these second valley locations to determine logical bits 5 and 6. So, for example, if the integer value is two ("2"), the valley sense locations are illustrated as the horizontal lines in the bottom right quadrant of the coding data structure 700. This narrows down sensing to valleys located between the bit value boundaries, thus two valley locations for logical bit 5 and a single valley location for logical bit 6.

In at least some embodiments, as discussed previously, the integer values (0, 1, or 2) converted for each of the first memory cell and the second memory cell can be combined and translated to the set of three logical bits using a decoding table such as Table 1. The first Vt state of the first memory cell can then be further translated, using the coding data structure 700, to logical bits 3 and 4. The second Vt state of the second memory cell can then be further translated, using the coding data structure 700, to logical bits 5 and 6. For example, to determine a particular (or "fine") Vt state, the control logic can identify a subset of predefined fine Vt ranges that corresponds with the previously identified coarse Vt range, e.g., the bottom four Vt ranges in the lower of Cell A, the middle four Vt ranges in the middle of Cell A, or the highest four Vt ranges in the upper of Cell A, as illustrated in FIG. 6. Each fine Vt range corresponds to a particular Vt state, so the control logic can perform sense operations in the valleys between each fine Vt range to determine the particular Vt state of any particular memory cell. Thus, each of the logical bits 3, 4, 5, and 6 can be related to such a particular Vt state.

In some embodiments, if the first set of three logical bits (e.g., converted from integer values 0, 1, 2) is not needed or not addressed, e.g., because a read request requests for other than the least-significant logical bits, the control logic can direct a sense amplifier to sense at all of the bit value boundaries for each logical bit that is requested. Thus, the control logic can direct one or more sense amplifiers to sense the valley locations at all the bit value boundaries within the series of threshold voltage levels across the 12 logical states illustrated in the coding data structure 700 for each requested logical bit. For example, if logical bits 3 and 6 are requested, the control logic can direct sensing at the four valley locations (horizontal lines) associated with bit value boundaries for logical bit 3 and sensing at the five valley locations (horizontal lines) associated with bit value boundaries for logical bit 6. These sensing operations should result in determination of the logical bits 3 and 6 (as either a "1" or "0" for each logical bit), which can be returned to the host system 120 in response to the read request without concern about the three least-significant logical bits.

Further in reference to both the indexing embodiments and the direct read embodiments associated with FIGS. 6-7, the values of logical bit 3 and logical bit 5 can be determined concurrently because these logical bits are encoded in the first and second memory cells, respectively. Further, values of logical bit 4 and logical bit 6 can be concurrently determined for the same reason. In this way, the control logic can be adapted to determine the bit values of a combined pair of memory cells with higher throughput and lower latency.

Figure 8:
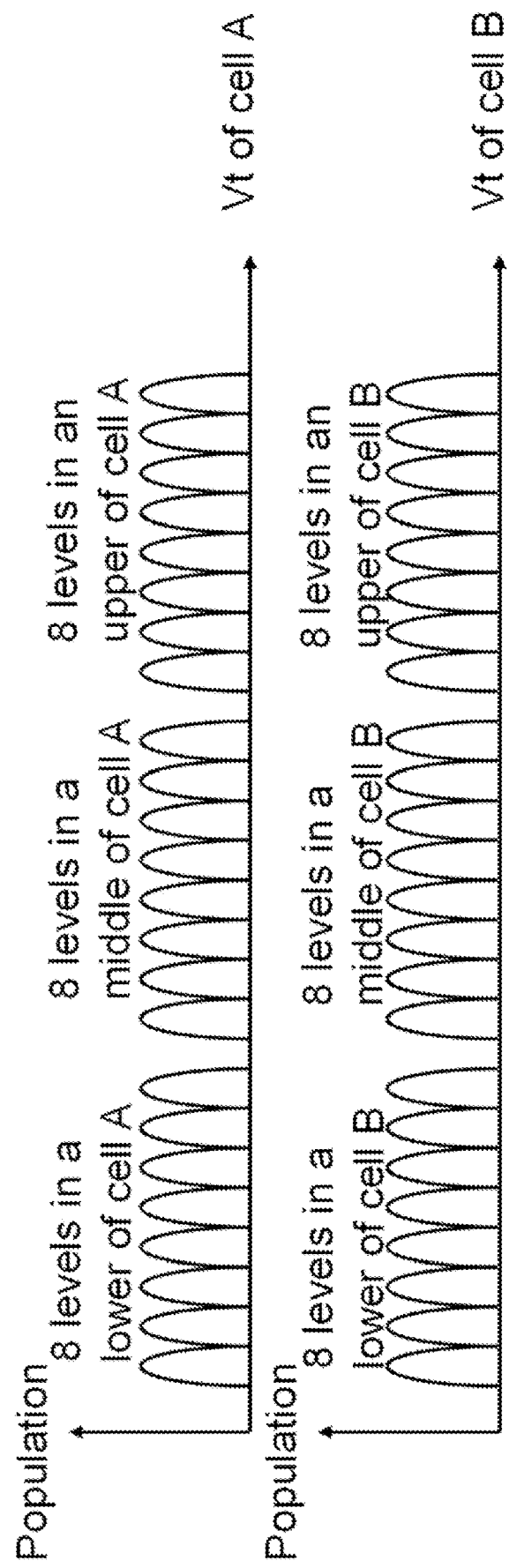
FIG. 8 is a graph of eight threshold voltage levels capable of being programmed to lower, middle, and upper portions of a first memory cell and a second memory cell according to some embodiments.

FIG. 8 is a graph of eight threshold voltage levels capable of being programmed to lower, middle, and upper portions of a first memory cell and a second memory cell according to the 4.5-bits-per cell embodiment. Four and a half ("4.5") bits per cell can be encoded per cell by encoding 9 bits in a pair of QLC memory cells, each having 24 Vt states. A total of 576 (e.g., 24×24) discrete Vt states are possible in two different cells, which can be a pair of adjacent memory cells. Of the 576 Vt states, 512 combined Vt states can be used to express 9 logical bits. Unlike encoding 4 logical bits or 5 logical bits per cell, an encoding/decoding scheme is employed to control read and program operations with 24 Vt states stored to each of the pair of memory cells. From 9 logical bits of user data, two 5-bits of control data would need to be employed, one for the first memory cell and another for the second memory cell, which imparts a heavy cost for encoding and decoding.

Instead of employing 512 Vt states to encode/decode all 9 logical bits, the first memory cell can store three ("3") logical bits that do not need to be combined with logical bits of another cell and 1.5 logical bits that are to be combined with logical bits of the second memory cell. Similarly, the second memory cell can store three ("3") logical bits that do not need to be combined with logical bits of another cell and 1.5 logical bits that are to be combined with the 1.5 logical bits of the first memory cell. The encoding and decoding of 3 logical bits across the two memory cells was discussed with reference to FIG. 4B and FIGS. 5A-5C.

Figure 9:
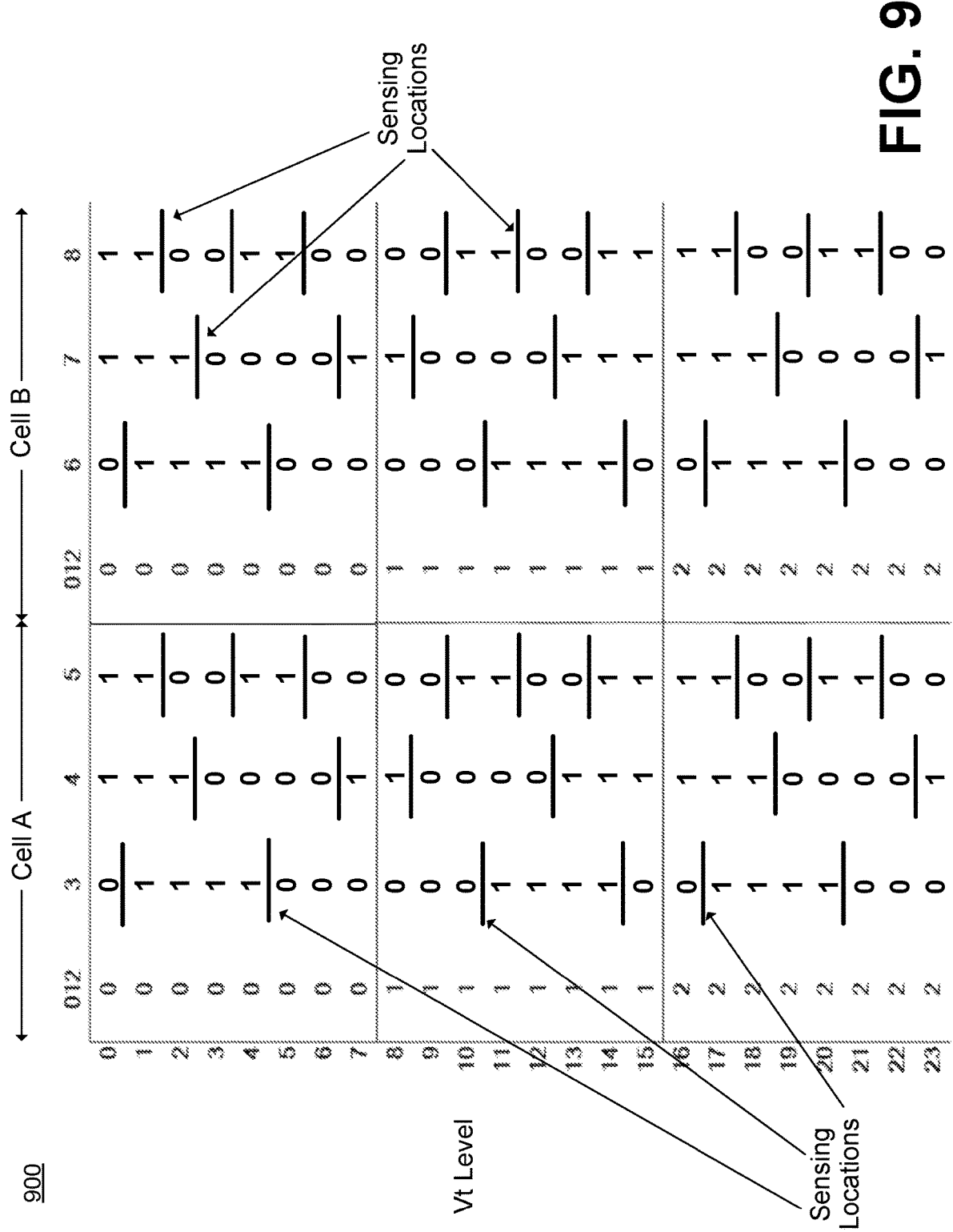
FIG. 9 is a graph illustrating a coding data structure for translating threshold voltage levels across the 24 levels (FIG. 8) of each memory cell into nine logical values of data for a combination of the first and second memory cells according to an embodiment.

FIG. 9 is a graph illustrating a coding data structure 900 for translating threshold voltage levels across the 24 levels (FIG. 8) of each memory cell into nine logical values of data for a combination of the first and second memory cells according to the QLC embodiment. The coding data structure 900 can be stored on the memory device 130 (e.g., the coding data structure 238 stored in the memory array 204) or in the local memory 119 or the controller 115, for example. The coding data structure 900, which can be a table in one embodiment, includes a series of threshold voltage (Vt) levels in the left-most column (e.g., Vt states 0 through 23) associated with both the first memory cell (Cell A) and the second memory cell (Cell B). The coding data structure 900 then includes the encoding of logical bits in the subsequent columns for each of the first memory cell (Cell A) and the second memory cell (Cell B).

In at least some embodiments, the first Vt state of the first memory cell is converted to a integer value of 0, 1, or 2, illustrated as the first column of the encoding columns for the first memory cell (Cell A). As discussed, the first Vt state can be determined using a low-resolution sense operation sufficient to determine in which grouping of Vt states the first Vt state resides, and thus a integer value of 0, 1, or 2. Subsequent columns for the first memory cell are logical bit encodings for logical bits 3, 4, and 5. Thus, the integer value converted for the first memory cell can be used as an index to determine first valley locations at bit value boundaries of a subset of the series of threshold voltage levels of the first memory cell. As a reminder, a bit value boundary is a valley between threshold voltage levels of the series of threshold voltage levels where a corresponding logical state changes from a low state, e.g., "0" value, to a high state, e.g., "1" value, or vice versa, illustrated with the short horizontal lines in FIG. 9. Further, the "subset" can be understood to be a subset of the Vt states illustrated as rows across the coding data structure 700. Control logic can then cause sensing at these first valley locations to determine logical bits 3, 4, and 5. So, for example, if the integer value is zero ("0"), the valley sense locations are illustrated as the horizontal lines in the top left quadrant of the coding data structure 900. This narrows down sensing to valleys located between the bit value boundaries, thus two valley locations for each of logical bit 3 and logical bit 4 and three valley locations for logical bit 5.

In these embodiments, the second Vt state of the second memory cell is converted to a integer value of 0, 1, or 2, illustrated as the first column of the encoding columns for the second memory cell (Cell B). As discussed, the second Vt state can be determined using a low-resolution sense operation sufficient to determine in which grouping of Vt states the second Vt state resides, and thus a integer value of 0, 1, or 2. Subsequent columns for the second memory cell are logical bit encoding for logical bits 6, 7, and 8. Thus, the integer value converted for the second memory cell can be used as an index to determine second valley locations at bit value boundaries of a second subset of the series of threshold voltage levels of the second memory cell. Control logic can then cause sensing at these second valley locations to determine logical bit 6, 7, and 8. So, for example, if the integer value is two ("2"), the valley sense locations are illustrated as the horizontal lines in the bottom right quadrant of the coding data structure 900. This narrows down sensing to valleys located between the bit value boundaries, thus two valley locations for each of logical bit 6 and logical bit 7 and a three valley locations for logical bit 8.

In at least some embodiments, as discussed previously, the integer values (0, 1, or 2) converted for each of the first memory cell and the second memory cell can be combined and translated to the set of three logical bits using a decoding table such as Table 1. The first Vt state of the first memory cell can then be further translated, using the coding data structure 900, to logical bits 3, 4, and 5. The second Vt state of the second memory cell can then be further translated, using the coding data structure 900, to logical bits 6, 7, and 8.

In some embodiments, if the first set of three logical bits (e.g., converted from integer values 0, 1, 2) is not needed or not addressed, e.g., because a read request requests for other than the least-significant logical bits, the control logic can direct a sense amplifier to sense at all of the bit value boundaries for each logical bit that is requested. Thus, the control logic can direct one or more sense amplifiers to sense the valley locations at all the bit value boundaries within the series of threshold voltage levels across the 24 logical states illustrated in the coding data structure 900 for each requested logical bit. For example, if logical bits 3 and 6 are requested, the control logic can direct sensing at the six valley locations (horizontal lines) associated with bit value boundaries for logical bit 3 and sensing at the six valley locations (horizontal lines) associated with bit value boundaries for logical bit 6. These sensing operations should result in determination of the logical bits 3 and 6 (as either a "1" or "0" for each logical bit), which can be returned to the host system 120 in response to the read request without concern about the three least-significant logical bits.

Further in reference to both the indexing embodiments and the direct read embodiments associated with FIGS. 8-9, the values of logical bit 3 and logical bit 6 can be determined concurrently because these logical bits are encoded in the first and second memory cells, respectively. Further, values of logical bit 4 and logical bit 7 can be concurrently determined for the same reason. Finally, values of logical bit 5 and logical bit 8 can also be determined concurrently for the same reason. In this way, the control logic can be adapted to determine the bit values of a combined pair of memory cells with higher throughput and lower latency.

With additional reference to FIGS. 1-2 and FIGS. 6-9, in some embodiments, a memory device includes a memory array having at least a first memory cell and a second memory cell and storing a coding data structure. The coding data structure can include multiple valley locations at bit value boundaries of a series of threshold voltage levels within the first memory cell and the second memory cell for each of multiple logical bits. The device further includes at least one sense amplifier coupled with the memory array and control logic, which is operatively coupled with the memory array and the sense amplifier. The control logic can reside in at least one or both of the local media controller 135 and the memory sub-system controller 115. In one embodiment, the coding data structure further includes a series of index values related to subsets of the multiple valley locations, each index value corresponding to a threshold voltage level of one of the first memory cell or the second memory cell.

In these embodiments, the control logic can receive a read request to determine one or more logical bits, of the multiple logical bits, from threshold voltage levels stored in a combination of the first memory cell and the second memory cell. The control logic can further identify, using the coding data structure, the multiple valley locations along the series of threshold voltage levels for each of the one or more logical bits. The control logic can further cause the at least one sense amplifier to sense the threshold voltage levels at the multiple valley locations within at least one of the first memory cell or the second memory cell associated with each of the one or more logical bits. The control logic can further return, in response to the read request, values of the one or more logical bits based on sensing the threshold voltage levels at the multiple valley locations for each of the one or more logical bits.

In one embodiment, the first memory cell and the second memory cell are each a triple-level cell (TLC) and the one or more logical bits include one or more of four most-significant logical bit values of seven logical bits encoded within the first and second memory cells. In another embodiment, the first memory cell and the second memory cell are each a quad-level cell (QLC) and the one or more logical bits include one or more of six most-significant logical bit values of nine logical bits encoded within the first and second memory cells.

Further, in response to the read operation including a request for the three least-significant bits of data stored in the combination of the first memory cell and the second memory cell, the control logic can further cause a first threshold voltage state read out of the first memory cell to be converted to a first integer value. The control logic can further cause a second threshold voltage state read out of the second memory cell to be converted to a second integer value. The control logic can further translate a combination of the first integer value and the second integer value state to the three least-significant logical bits. In some embodiments, the above-mentioned translating can include: accessing a decoding table that relates different combinations of the first and second integer values to different combinations of the three least-significant logical bits, and translating, using the decoding table, the combination of the first and second integer values into the three least-significant bits of data.

Figure 10:
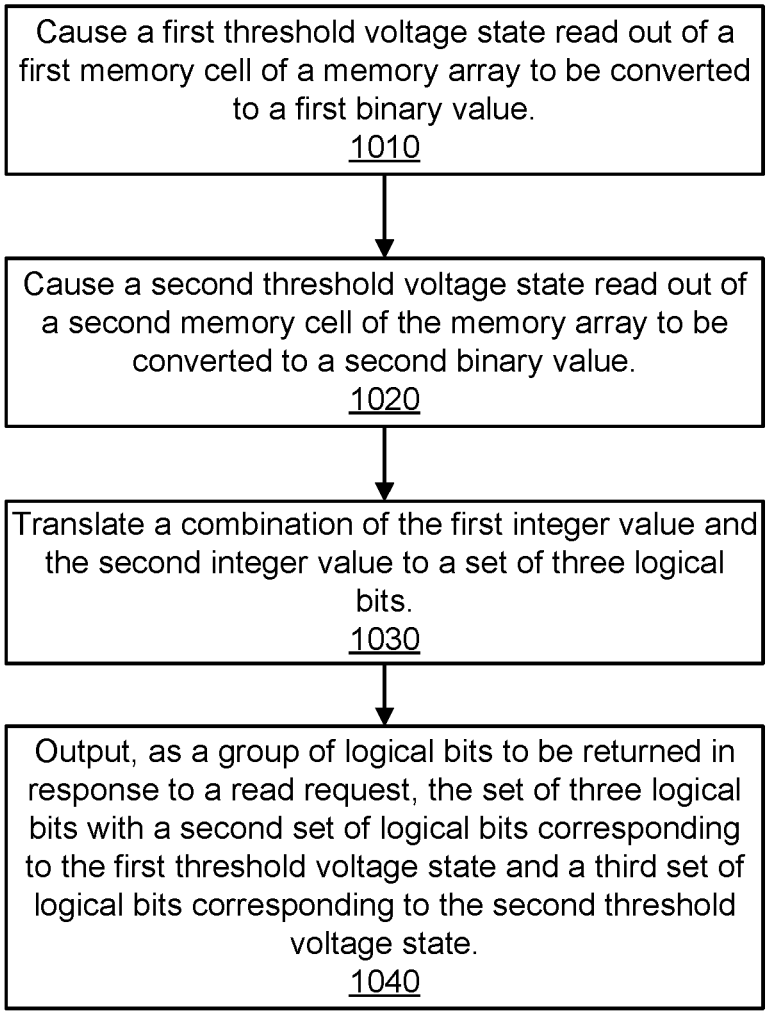
FIG. 10 is a flow diagram of an example method of decoding data stored in a combination of a first memory cell and a second memory cell according to some embodiments.

FIG. 10 is a flow diagram of an example method of decoding data stored in a combination of a first memory cell and a second memory cell according to some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 the processing logic is control logic located within the local media controller 135 and/or within the memory sub-system controller 115.

At operation 1010, a first Vt state is converted. For example, the processing logic causes a first threshold voltage state read out of a first memory cell of a memory array to be converted to a first integer value, e.g., one of 0, 1, or 2.

At operation 1020, a second Vt state is converted. For example, the processing logic causes a second threshold voltage state read out of a second memory cell of the memory array to be converted to a second integer value, e.g., one of 0, 1, or 2 or the like. The conversions in operations 1010 and 1020 can be understood in more detail with reference to FIGS. 4A-4B and FIGS. 5A-5C.

At operation 1030, the integer values are translated. For example, the processing logic translates a combination of the first integer value and the second integer value to a set of three logical bits, e.g., via use of a decoding table such as Table 1. In one embodiment, this set of three logical bits are the three least-significant bits of the below-referenced group of bits.

At operation 1040, a group of bits is output. For example, the processing logic outputs, as a group of bits to be returned in response to a read request, the set of three bits with a second set of logical bits corresponding to the first threshold voltage state and a third set of logical bits corresponding to the second threshold voltage state. For example, the second set of logical bits can be directly decoded from the first threshold voltage state and the third set of logical bits can be directly decoded from the second threshold voltage state, e.g., using the coding data structure 700 of FIG. 7 or the coding data structure 900 of FIG. 9.

In one embodiment, the set of three bits is combined with 2 logical bits independently decoded from the first memory cell and 2 bits independently decoded from the second memory cell for a total of 7 logical bits from the pair of memory cells (e.g., the 3.5 bits-per-cell embodiment). In another embodiment, the set of three bits is combined with 3 bits independently decoded from the first memory cell with 3 bits independently decoded from the second memory cell for a total of 9 logical bits from the pair of memory cells (e.g., the 4.5 bits-per cell embodiment). Additional, related embodiments are envisioned using other MLC memory, such as PLC memory cells, so long as multiple memory cells are combined to encode and decode an additional bit between the multiple memory cells.

Figure 11:
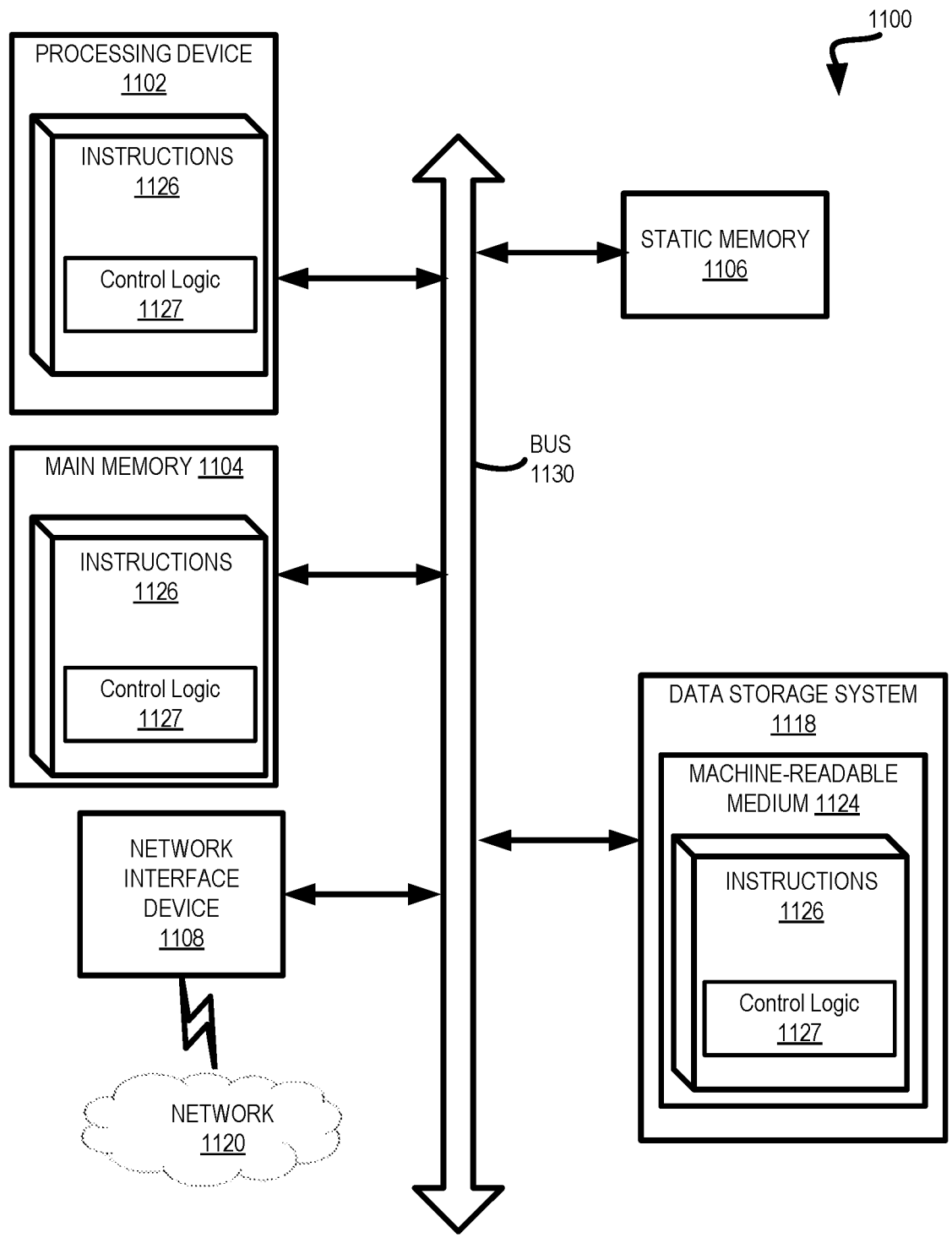
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory sub-system controller 115 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The instructions 1126 can further include control logic 1127, such as the control logic referenced located within one or both of the local media control 135 and the memory sub-system controller 115. The computer system 1100 can further include a network interface device 1112 to communicate over the network 1120.

The data storage system 1118 can include a machine-readable storage medium 1124 (also known as a computer-readable medium) on which is stored one or more sets of instructions 1126 or software embodying any one or more of the methodologies or functions described herein. The data storage system 1118 can further include the local media controller 135 and the page buffer 138 that were previously discussed. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to a controller (e.g., the memory sub-system controller 115 and/or the local media controller 135 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
a memory array comprising at least a first memory cell and a second memory cell; and
control logic, operatively coupled with the memory array, the control logic to perform operations comprising:
causing a first threshold voltage state read out of the first memory cell to be converted to a first integer value;
causing a second threshold voltage state read out of the second memory cell to be converted to a second integer value;
translating a combination of the first integer value and the second integer value to a set of three logical bits; and
outputting, as a group of logical bits to be returned in response to a read request, the set of three logical bits with a second set of logical bits corresponding to the first threshold voltage state and a third set of logical bits corresponding to the second threshold voltage state.

2. The device of claim 1, wherein the first memory cell and the second memory cell are a pair of adjacent memory cells, the device further comprising a pair of three-level column latches to temporarily store the first threshold voltage state as the first integer value and the second threshold voltage state as the second integer value.

3. The device of claim 1, wherein the first memory cell and the second memory cell are each a triple-level cell and the group of logical bits comprise seven logical bits.

4. The device of claim 1, wherein the first memory cell and the second memory cell are each a quad-level cell and the group of logical bits comprise nine logical bits.

5. The device of claim 1, wherein translating comprises indexing within a decoding table using the first and second integer values to determine the set of three logical bits, and wherein the set of three logical bits are the least-significant logical bits of the group of logical bits.

6. The device of claim 1, further comprising a first sense amplifier coupled to the memory array and the control logic, wherein the operations further comprise:
determining, using the first integer value to index into a coding table, first valley locations at bit value boundaries of a subset of a series of threshold voltage levels of the first memory cell;
causing the first sense amplifier to sense a first threshold voltage level at one of the first valley locations of the first memory cell; and
determining values of the second set of logical bits corresponding to the first threshold voltage level.

7. The device of claim 6, further comprising a second sense amplifier coupled to the memory array and the control logic, wherein the operations further comprise:
determining, using the second integer value to index into the coding table, second valley locations at bit value boundaries of a second subset of the series of threshold voltage levels of the second memory cell;
causing the second sense amplifier to sense a second threshold voltage level at one of the second valley locations of the second memory cell; and
determining values of the third set of logical bits corresponding to the second threshold voltage level.

8. A device comprising:
a memory array comprising at least a first memory cell and a second memory cell and storing a coding data structure comprising a plurality of valley locations at bit value boundaries of a series of threshold voltage levels within the first memory cell and the second memory cell for each of a plurality of logical bits;

at least one sense amplifier coupled with the memory array; and control logic, operatively coupled with the memory array and the sense amplifier, the control logic to perform operations comprising:

receiving a read request to determine one or more logical bits, of the plurality of logical bits, from threshold voltage levels stored in a combination of the first memory cell and the second memory cell;

identifying, using the coding data structure, the plurality of valley locations along the series of threshold voltage levels for each of the one or more logical bits;

causing the at least one sense amplifier to sense the threshold voltage levels at the plurality of valley locations within at least one of the first memory cell or the second memory cell associated with each of the one or more logical bits; and returning, in response to the read request, values of the one or more logical bits based on sensing the threshold voltage levels at the plurality of valley locations for each of the one or more logical bits.

9. The device of claim 8, wherein the first memory cell and the second memory cell are a pair of adjacent memory cells.

10. The device of claim 8, wherein the first memory cell and the second memory cell are each a triple-level cell and the one or more logical bits comprise one or more of four most-significant logical bit values of seven logical bits encoded within the first and second memory cells.

11. The device of claim 8, wherein the first memory cell and the second memory cell are each a quad-level cell and the one or more logical bits comprise one or more of six most-significant logical bit values of nine logical bits encoded within the first and second memory cells.

12. The device of claim 8, wherein the coding data structure further comprises a series of index values related to subsets of the plurality of valley locations, each index value corresponding to a threshold voltage level of one of the first memory cell or the second memory cell, and wherein, in response to the read request requesting the three least-significant logical bits encoded within a combination of the first and second memory cells, the operations further comprising:

causing a first threshold voltage state read out of the first memory cell to be converted to a first integer value;

causing a second threshold voltage state read out of the second memory cell to be converted to a second integer value;

translating a combination of the first integer value and the second integer value to the three least-significant logical bits.

13. The device of claim 12, wherein translating comprises:

accessing a decoding table that relates different combinations of integer values to different combinations of the three least-significant logical bits; and translating, using the decoding table, the combination of the first and second integer values into the three least-significant bits of data.

14. A method comprising:

causing, by control logic of a memory device, a first threshold voltage state read out of a first memory cell of a memory array to be converted to a first integer value;

causing, by the control logic, a second threshold voltage state read out of a second memory cell of the memory array to be converted to a second integer value;

translating, by the control logic, a combination of the first integer value and the second integer value to a set of three logical bits; and outputting, by the control logic, as a group of logical bits to be returned in response to a read request, the set of three logical bits with a second set of logical bits corresponding to the first threshold voltage state and a third set of logical bits corresponding to the second threshold voltage state.

15. The method of claim 14, further comprising:

accessing a pair of adjacent memory cells to access the first memory cell and the second memory cell;

converting, using a first three-level column latch, the first threshold voltage state to the first integer value; and converting, using a second three-level column latch, the second threshold voltage state to the second integer value.

16. The method of claim 14, wherein the first memory cell and the second memory cell are each a triple-level cell and the group of logical bits comprise seven logical bits.

17. The method of claim 14, wherein the first memory cell and the second memory cell are each a quad-level cell and the group of logical bits comprise nine logical bits.

18. The method of claim 14, wherein translating comprises indexing within a decoding table using the combination of the first and second integer values to determine the set of three logical bits, and wherein the set of three logical bits are the least-significant logical bits of the group of logical bits.

19. The method of claim 14, further comprising:

determining, using the first integer value to index into a coding table, first valley locations at bit value boundaries of a subset of a series of threshold voltage levels of the first memory cell;

causing a first sense amplifier to sense a first threshold voltage level at one of the first valley locations of the first memory cell; and determining values of the second set of logical bits corresponding to the first threshold voltage level.

20. The method of claim 19, further comprising:

determining, using the second integer value to index into the coding table, second valley locations at bit value boundaries of a second subset of the series of threshold voltage levels of the second memory cell;

causing a second sense amplifier to sense a second threshold voltage level at one of the second valley locations of the second memory cell; and determining values of the third set of logical bits corresponding to the second threshold voltage level.

* * * * *